(12) United States Patent
Kimura

(10) Patent No.: US 11,099,491 B2
(45) Date of Patent: Aug. 24, 2021

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Atsushi Kimura, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 334 days.

(21) Appl. No.: 16/025,279

(22) Filed: Jul. 2, 2018

(65) Prior Publication Data

US 2019/0011844 A1 Jan. 10, 2019

(30) Foreign Application Priority Data

Jul. 4, 2017 (JP) .............................. JP2017-131489

(51) Int. Cl.
*G03F 9/00* (2006.01)
*G03F 7/00* (2006.01)

(52) U.S. Cl.
CPC .......... *G03F 9/7042* (2013.01); *G03F 7/0002* (2013.01)

(58) Field of Classification Search
CPC .............................. G02F 9/7042; G02F 7/0002
See application file for complete search history.

(56) References Cited

U.S. PATENT DOCUMENTS

| 7,292,326 B2 | 11/2007 | Nimmakayala et al. |
| 9,958,773 B2 | 5/2018 | Okada et al. |

| 2007/0182944 A1* | 8/2007 | Van De Biggelaar ...... G03B 27/42 355/53 |
| 2008/0200998 A1* | 8/2008 | Baggen ..................... G05B 5/01 700/45 |
| 2011/0133354 A1* | 6/2011 | Kimura ................. B82Y 10/00 264/40.5 |
| 2013/0015598 A1* | 1/2013 | Kimura ................. B82Y 10/00 264/40.1 |

(Continued)

FOREIGN PATENT DOCUMENTS

| JP | S62235788 A | 10/1987 |
| JP | 2008522412 A | 6/2008 |

(Continued)

OTHER PUBLICATIONS

Office Action issued in Korean Application No. 10-2018-0076354 dated Nov. 30, 2020.

*Primary Examiner* — Kelly M Gambetta
(74) *Attorney, Agent, or Firm* — Rossi, Kimms & McDowell LLP

(57) ABSTRACT

The present invention provides an imprint apparatus which forms a pattern of an imprint material on a substrate by using a mold, the apparatus comprising: a driver configured to drive the mold and the substrate relatively; a measurement device configured to measure a relative position between the mold and the substrate; and a controller configured to, in alignment between the mold and the substrate, control the driver based on a signal obtained by combining, with a first signal according to a deviation between the relative position measured by the measurement device and a target relative position, second signals with time intervals therebetween and that momentarily increase a driving force of the driver.

14 Claims, 5 Drawing Sheets

(56) References Cited

U.S. PATENT DOCUMENTS

2015/0290871 A1* 10/2015 Okada ................ G03F 7/0002
  264/40.7
2016/0009021 A1   1/2016 Okada et al.

FOREIGN PATENT DOCUMENTS

| | | |
|---|---|---|
| JP | 2015204419 A | 11/2015 |
| JP | 2016021441 A | 2/2016 |
| JP | 2017063111 A | 3/2017 |
| KR | 1020080076794 A | 8/2008 |
| KR | 1020150118916 A | 10/2015 |
| WO | 2007046820 A2 | 4/2007 |

\* cited by examiner

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus that forms a pattern of an imprint material on a substrate by using a mold on which a pattern composed of concave and convex portions is formed has been getting attention as one type of mass-lithography apparatus for semiconductor devices or the like. There is a demand to be able to perform alignment of the mold and the substrate with high precision in the imprint apparatus in order to precisely transfer the mold pattern to the imprint material on the substrate. In Japanese Patent Laid-Open No. 2008-522412, a method of controlling alignment between a mold and a substrate in a state in which the mold and an imprint material on the substrate are caused to be in contact is proposed.

Since, due to the viscosity of the imprint material, it is difficult to change the relative position between the mold and the substrate in the state in which the mold and the imprint material on the substrate are brought into contact with each other, there may be a disadvantage in terms of throughput.

SUMMARY OF THE INVENTION

The present invention provides an imprint apparatus that is advantageous in terms of throughput, for example.

According to one aspect of the present invention, there is provided an imprint apparatus which forms a pattern of an imprint material on a substrate by using a mold, the apparatus comprising: a driver configured to drive the mold and the substrate relatively; a measurement device configured to measure a relative position between the mold and the substrate; and a controller configured to, in alignment between the mold and the substrate, control the driver based on a signal obtained by combining, with a first signal according to a deviation between the relative position measured by the measurement device and a target relative position, second signals with time intervals therebetween and that momentarily increase a driving force of the driver.

Further features of the present invention will become apparent from the following description of exemplary embodiments with reference to the attached drawings.

DESCRIPTION OF THE EMBODIMENTS

Figure 1:
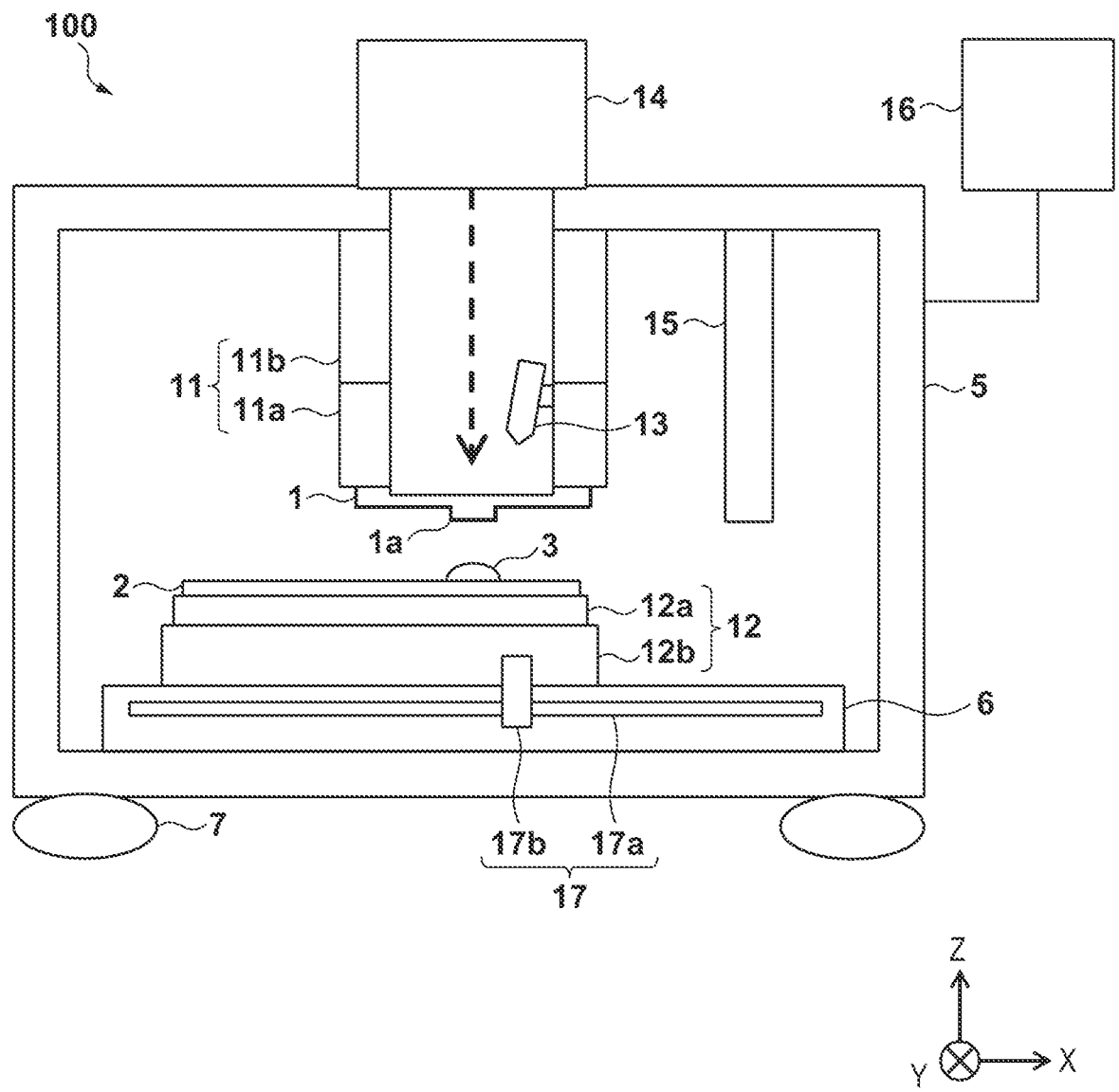
FIG. 1 is a schematic view for illustrating a configuration of an imprint apparatus.

Exemplary embodiments of the present invention will be described below with reference to the accompanying drawings. Note that the same reference numerals denote the same members throughout the drawings, and a repetitive description thereof will not be given. Directions parallel to the surface of a substrate (directions following the surface of the substrate) are made to be the X direction and the Y direction, and a direction orthogonal to the surface of the substrate (the direction of an optical axis of light incident on the substrate) is made to be the Z direction.

First Embodiment

Description is given for an imprint apparatus 100 of a first embodiment according to the present invention. The imprint apparatus is an apparatus for forming a pattern of a cured material to which a mold pattern composed of concave and convex portions has been transferred, by causing the mold and an imprint material supplied onto a substrate to be in contact and providing energy for curing to the imprint material. For example, the imprint apparatus 100 of the present embodiment supplies an imprint material 3 onto a substrate, and cures the imprint material 3 in a state where a mold 1, on which the pattern composed of concave and convex portions is formed, is caused to be in contact with the imprint material 3 on the substrate. By widening an interval between the mold 1 and a substrate 2 to separate (release) the mold 1 from the cured imprint material 3, the pattern of the imprint material 3 is formed on the substrate. There are cases where a series of processes performed by the imprint apparatus 100 in this fashion is referred to as an "imprint process" below.

For the imprint material, a curable composition (also referred to as a resin in an uncured state) that is cured by being provided with energy for curing is used. An electromagnetic wave, heat, or the like is used as the energy for curing. The electromagnetic wave is light such as infrared light, visible light, or ultraviolet light whose wavelength is selected from a range of greater than or equal to 10 nm and less than or equal to 1 mm, for example.

The curable composition is a composition that is cured in accordance with being heated or in accordance with irradiation of light. Out of these, a photo-curable composition that is cured in accordance with light contains at least a polymerizable compound and a photopolymerization initiator, and may contain a solvent or a non-polymerizable compound as necessary. A non-polymerizable compound is of at least one selected from the group of a sensitizer, a hydrogen donor, an internal mold release agent, a surfactant, an antioxidant, a polymeric component, or the like.

The imprint material is applied as a film onto the substrate by a spin coater or a slit coater. Alternatively, it may be applied onto the substrate in a droplet shape, as a film or in an island form achieved by a plurality of droplets connecting, in accordance with a liquid jet head. A viscosity of the imprint material (a viscosity at 25° C.) is greater than or equal to 1 mPa·s and less than or equal to 100 mPa·s, for example.

[Configuration of Imprint Apparatus]

FIG. 1 is a schematic view for illustrating a configuration of the imprint apparatus 100 of the embodiment. The imprint apparatus 100 may comprise an imprint head 11, a substrate stage 12 (stage), a measurement device 13, a curing device 14, a dispenser 15 (supply device), and a controller 16. The imprint head 11, the measurement device 13, the curing device 14, and the dispenser 15 are respectively supported by a structure 5, and the substrate stage 12 is configured to be able to move on a plate 6. The structure 5 may be installed on a floor via a vibration reduction mechanism 7 that uses an air spring. Also, the controller 16 has a CPU, a memory (a storage), or the like, for example, and controls the imprint process (controls each unit of the imprint apparatus 100).

The mold 1 is ordinarily manufactured by a material through which ultraviolet light can pass, such as quartz, and a pattern composed of concave and convex portions for transferring to the imprint material 3 on the substrate is formed on a partial region (a pattern area 1a) of the surface on the side of the substrate. Also, glass, ceramic, metal, a semiconductor, a resin, or the like is used as a substrate 2, and a member consisting of a material that is different to that of the substrate may be formed on its obverse side as necessary. Specifically, a silicon wafer, a compound semiconductor, a wafer, a quartz glass, or the like may be used as the substrate 2. Also, prior to application of the imprint material, an adhesion layer may be provided as necessary in order to improve adhesion between the imprint material and the substrate.

The imprint head 11 may include, for example, a mold holder 11a for holding the mold 1 by a vacuum chuck or the like and a mold driver 11b for driving the mold 1 (the mold holder 11a) in the Z direction so as to change the interval between the mold 1 and the substrate 2. The imprint head 11 of the present embodiment is configured so as to drive the mold 1 in the Z direction, but there may be a function for driving the mold 1 in the X and Y directions and the θ direction (the direction of rotation about the Z-axis), for example.

The substrate stage 12 may comprise, for example, a substrate holder 12a for holding the substrate 2 by vacuum suction or the like, and a substrate holder 12b configured to be able to move on the plate 6 so as to drive the substrate 2 (the substrate holder 12a) in the X and Y directions. The substrate stage 12 of the present embodiment is configured so as to drive the substrate 2 in the X and Y directions, but there may also be a function for driving the substrate 2 in the Z direction and the θ direction or the like, for example. Also, the (X and Y direction) position of the substrate stage 12 may be measured by a position measurement device 17. For example, an encoder, a laser interferometer, or the like may be used as the position measurement device 17. In the example illustrated in FIG. 1, an encoder consisting of a scale 17a provided on the plate 6 and a main body 17b that is provided on the substrate stage 12 and that is for reading the scale 17a is used as the position measurement device 17. The position measurement device 17 of the present embodiment is configured so as to measure a position of the substrate stage 12 (the substrate 2), but may be configured to be able to measure a relative position between the imprint head 11 and the substrate stage 12.

In the present embodiment, relative driving between the mold 1 and the substrate 2 in order to change the interval (a Z direction) between the mold 1 and the substrate 2 is performed by the imprint head 11, but limitation is not made to this, and this may be performed by the substrate stage 12, and may be performed by both. Also, while a change in the relative position between the mold 1 and the substrate 2 in the X and Y directions is made by the substrate stage 12, limitation is not made to this, and this may be performed by the imprint head 11, and this may be performed by both. In other words, at least one of the imprint head 11 (the mold driver 11b) and the substrate stage 12 (the substrate holder 12b) may be used as a driver for driving the mold 1 and the substrate 2 relatively.

The measurement device 13 has a scope that includes an image sensor, for example, and measures the relative position between the mold 1 and the substrate 2 by detecting, with the scope, the positional relationship between a mark provided on the mold 1 (the pattern area 1a) and a mark provided on the substrate 2 (shot region). Also, the curing device 14, in a state in which the mold 1 and the imprint material 3 on the substrate are in contact, irradiates light (for example, ultraviolet light) onto the imprint material 3 via the mold 1, and thereby cures the imprint material 3. The dispenser 15 dispenses (supplies) the imprint material 3 (uncured resin) onto the substrate by an ink-jet method, for example.

[Imprint Process]

Figure 2:
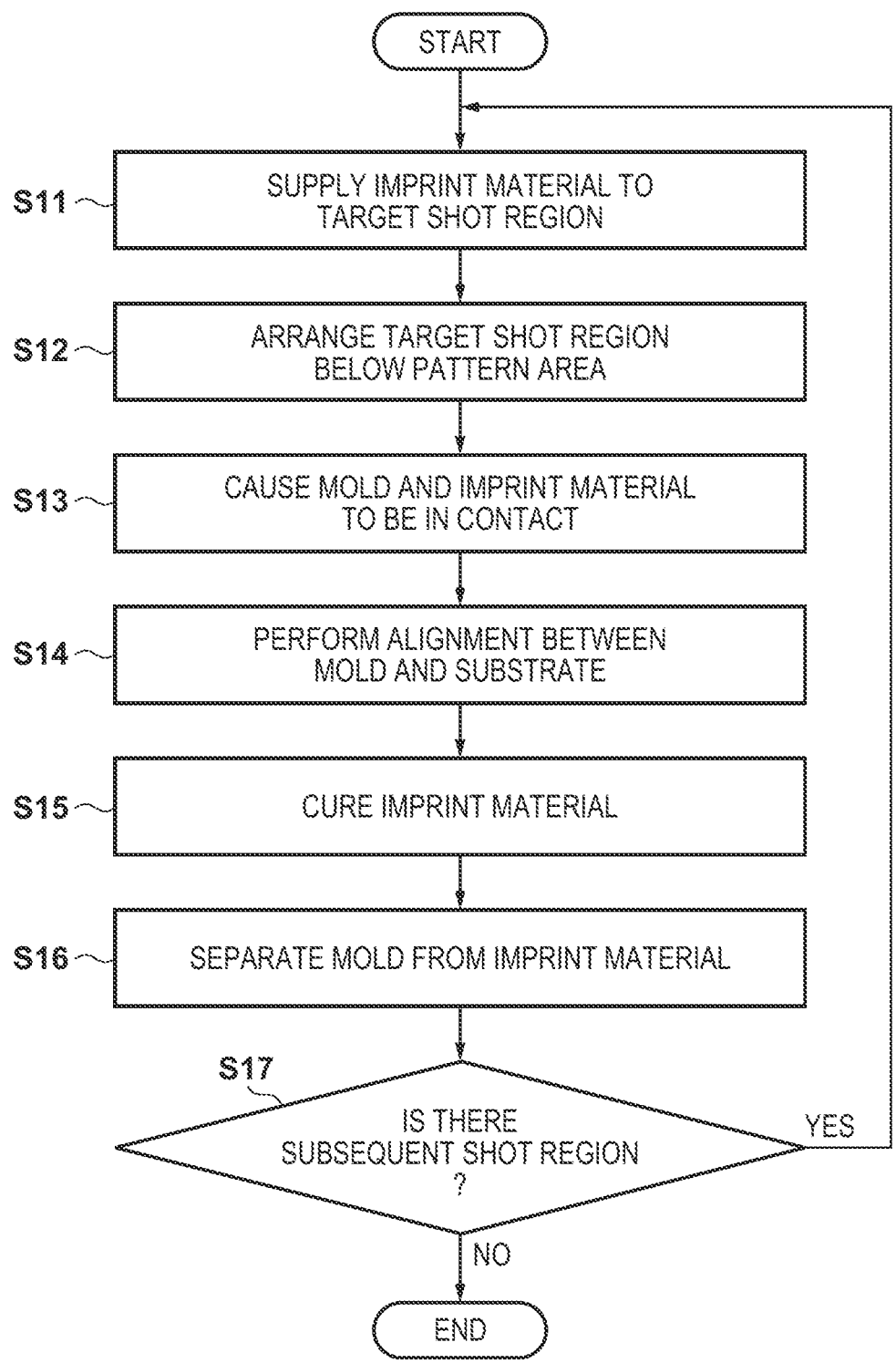
FIG. 2 is a flowchart for describing an imprint process.

Next, the imprint process that is performed by the imprint apparatus 100 of the present embodiment will be described with reference to FIG. 2. FIG. 2 illustrates an imprint process flowchart, and each step in this flowchart may be controlled by the controller 16.

In step S11, the controller 16 controls the substrate stage 12 so as to arrange below the dispenser 15 a target shot region (hereinafter, target shot region) in which to perform the imprint process, among a plurality of shot regions on the substrate 2. Then, the dispenser 15 is controlled so as to dispense the imprint material 3 onto the target shot region. In step S12, the controller 16 controls the substrate stage 12 such that the target shot region is arranged below the pattern area 1a of the mold 1. In step S13, the controller 16 controls the imprint head 11 such that the interval between the mold 1 and the substrate 2 becomes narrower, and causes the mold 1 and the imprint material 3 on the target shot region to be in contact.

In step S14, the controller 16, in a state in which the mold 1 and the imprint material 3 on the target shot region are caused to be in contact, performs alignment (an alignment process) between the mold 1 and the substrate 2 based on a result of measurement in the measurement device 13. For example, the controller 16 causes the measurement device 13 to detect a positional relationship between the mark provided on the pattern area 1a and the mark provided on the target shot region, and measure the relative position between the pattern area 1a and the target shot region. Also, the controller 16 performs feedback control for the relative position of the mold 1 and the substrate 2 so that a deviation between the relative position measured by the measurement device 13 and a target relative position falls within an allowable range. Details of the alignment process will be described later.

In step S15, the controller 16, in a state in which the mold 1 and the imprint material 3 on the target shot region are in contact, controls the curing device 14 so as to irradiate light (ultraviolet light) onto the imprint material 3, and thereby cures the imprint material 3 on the target shot region. In step S16, the controller 16 controls the imprint head 11 such that the interval between the mold 1 and the substrate 2 becomes wider, and separates (releases) the mold 1 from the cured imprint material 3. In step S17, the controller 16 determines whether or not there is a shot region (a subsequent shot region) on which the imprint process is to be performed on the substrate. In the case where there is a subsequent shot region, step S11 is advanced to, and in the case where there is no subsequent shot region, the processing ends.

[Alignment Process]

Figure 3:
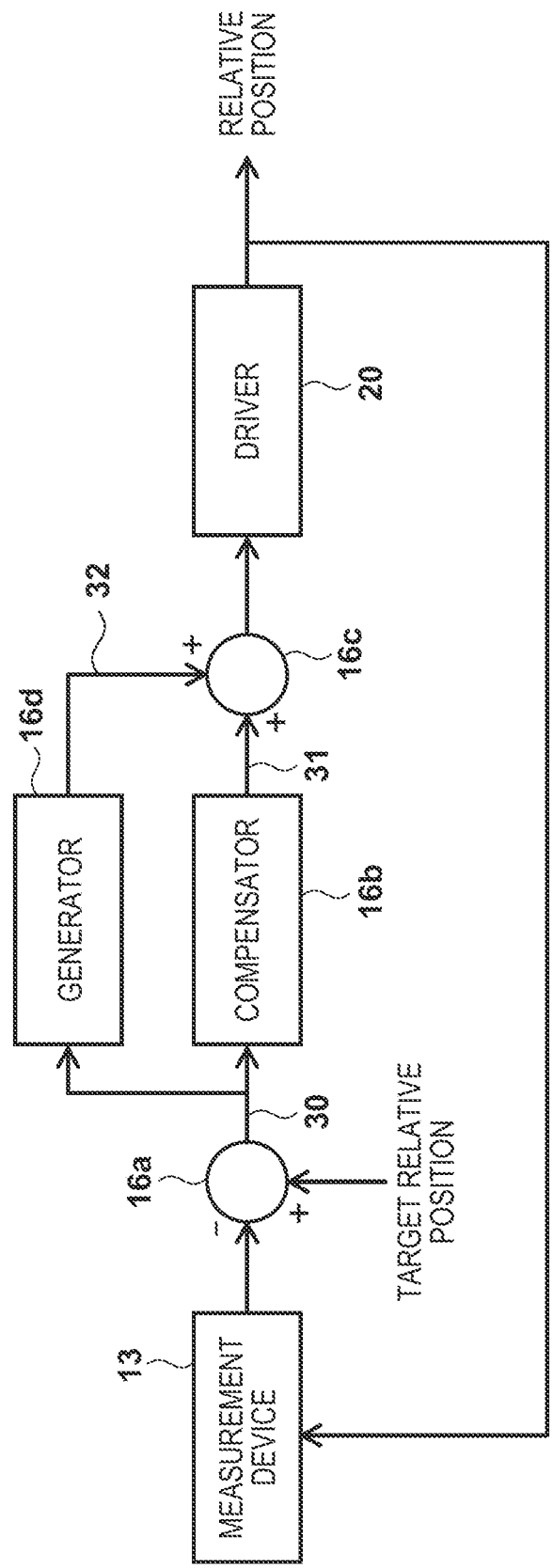
FIG. 3 is a block diagram for illustrating a control system for an alignment process.

Next, details of the alignment process of step S14 will be described. FIG. 3 is a block diagram for illustrating a control system for an alignment process in the embodiment. A subtractor 16a, a compensator 16b, an adder 16c, and a generator 16d in the block diagram of FIG. 3 are each able to function as constituent elements of the controller 16. Also, a driver 20 may comprise an actuator that generates a driving force (thrust) for driving the mold 1 and the substrate 2 relatively and a supplier (current driver) for supplying current (or voltage) to the actuator, for example. The driver 20, as described above, may comprise at least one of the mold driver 11b and the substrate holder 12b.

In the control system for an alignment process for the mold 1 and the substrate 2, first, a relative position between the mold 1 and the substrate 2 is measured by the measurement device 13, and the result of the measurement (information indicating the relative position) is supplied to the subtractor 16a. The subtractor 16a calculates a deviation 30 between the relative position measured by the measurement device 13 and a target relative position (for example, the zero), and outputs the calculated deviation 30. The compensator 16b is, for example, a PID compensator, and generates a first signal 31 (first command value) for controlling the driver 20 so that the deviation 30 calculated by the subtractor 16a decreases (so that it falls within an allowable range for example), and supplies the generated first signal 31 to the driver 20. The driver 20, in accordance with the first signal 31 generated by the compensator 16b, supplies a current to the actuator by the supplier, and causes the actuator to generate a driving force. Consequently, it is possible to drive the mold 1 and the substrate 2 relatively so that the relative position of the mold 1 and the substrate 2 approaches a target relative position.

Such an alignment process, as described above, is performed in a state in which the mold 1 and the imprint material 3 on the substrate are caused to be in contact. However, in this state, due to the viscosity of the imprint material 3, there is a resistance force that impedes a change in the relative position (X and Y directions) between the mold 1 and the substrate 2, and it is difficult to change the relative position. The result of this is that a fair amount of time is required for the alignment process, which may be disadvantageous in terms of throughput. Accordingly, the imprint apparatus 100 of the present embodiment, in the alignment process, adds to the first signal 31 second signals 32 (second command value) with time intervals therebetween and that momentarily increase the driving force of the driver 20 and supplies the result to the driver 20. For example, as illustrated in the block diagram of FIG. 3, the generator 16d which generates the second signals 32 is provided in the controller 16. The generator 16d discretely generates and outputs second signals 32 with time intervals therebetween. The second signals 32 outputted from the generator 16d are added by the adder 16c to (combined with) the first signal 31 outputted by the compensator 16b, and the combined signal is supplied to the driver 20. Consequently, since the driving force of the driver 20 momentarily and discretely increases, the relative position between the mold 1 and the substrate 2 changes, in a hammering-like fashion, and it is thereby possible to effectively (efficiently) perform the alignment process.

The generator 16d may generate, as the second signal 32, a pulse signal (impulse signal) that has an amplitude that momentarily increases the driving force of the driver 20 by 0.1N or more (more advantageously increases by 0.5N or more), for example. The maximum value of the amplitude of the second signal 32 is restricted by the maximum driving force that can be generated by the driver 20, but preferably the second signal 32 is generated such that the driving force generated momentarily by the driver 20 is 1N or less. Also, the generator 16d may generate the second signal 32 so as to have a pulse width that is less than or equal to a control clock period of the controller 16 (CPU) or less than or equal to a sampling period of a feedback control system. More preferably, the generator 16d may generate the second signal 32 to have a pulse width that is ½ or less the control clock period of the controller 16 (CPU) or ½ or less the sampling period of the feedback control system. Also, the generator 16d may set the time interval in which the second signal 32 is outputted discretely to the pulse width of the second signal 32 or more. More preferably, the generator 16d may set the time interval in which to output the second signal 32 discretely to be greater than or equal to the period of the control clock of the controller 16 (CPU) or greater than or equal to the sampling period of the feedback control system. Here, the pulse width of the second signal 32 is defined as the time at which the amplitude becomes 50% or more of the maximum value (so-called half bandwidth), and the second signal 32 may comprise a triangular or trapezoidal signal.

[Method of Generating Second Signal]

Next, the method of generating the second signals by the generator 16d is described specifically. FIG. 4A is a view illustrating a temporal change in the deviation 30 calculated by the subtractor 16a, and FIG. 4B is a view illustrating the second signals 32 outputted by the generator 16d. Hereinafter, the deviation 30 calculated by the subtractor 16a may be referred to as simply as "the deviation 30", and the time intervals by which the generator 16d outputs the second signals 32 (time intervals by which the second signals 32 are supplied to the driver 20) may be referred to simply as "the time interval".

The generator 16d, as illustrated in the block diagram of FIG. 3, may be configured to set (decide) the amplitude of the second signal 32 and the time interval by which to output the second signals 32, based on the deviation calculated by the subtractor 16a. In other words, the generator 16d may, based on the deviation 30 calculated by the subtractor 16a, change at least one of the amplitude and the time interval of the second signal 32.

Figure 4:
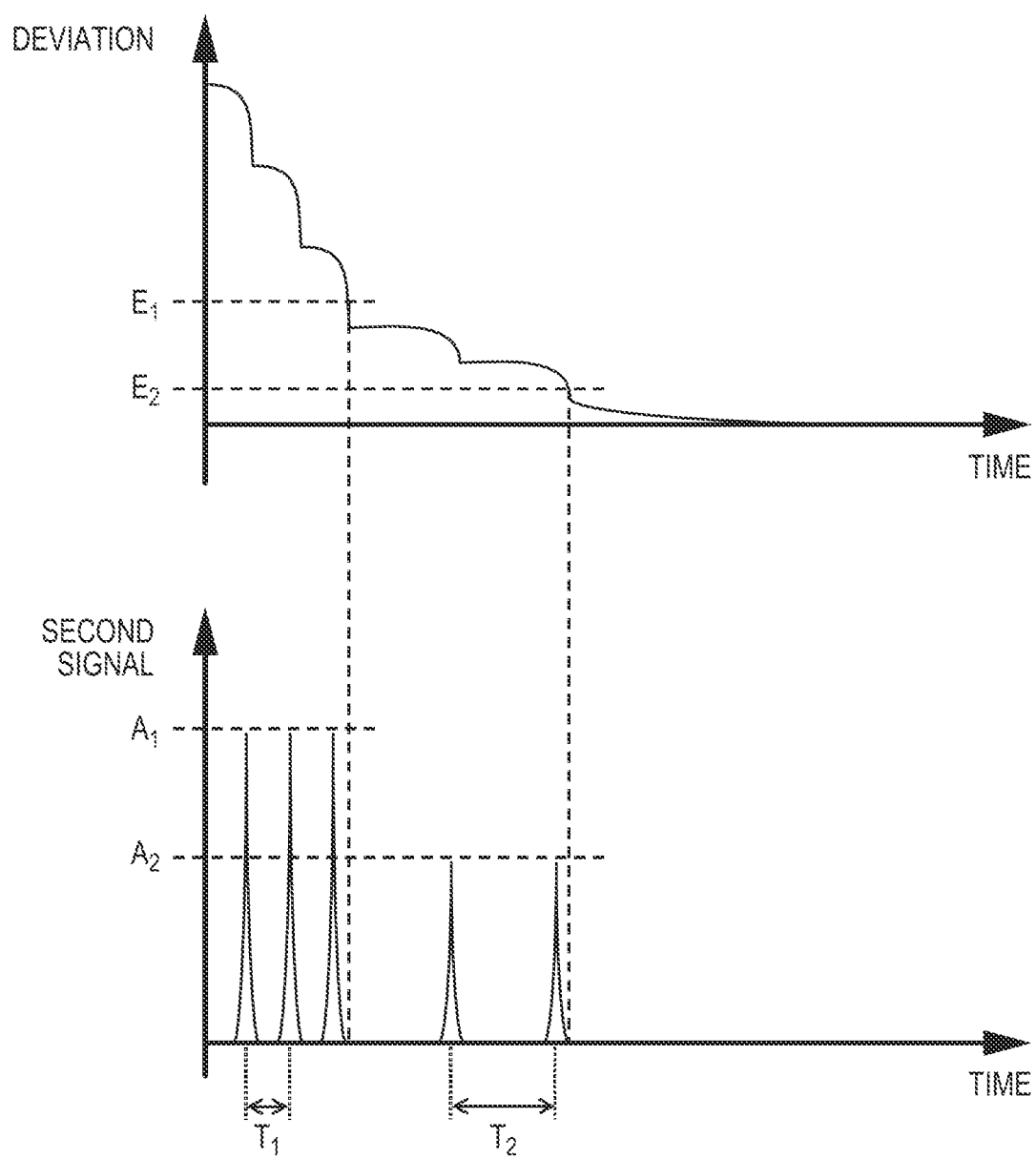
FIG. 4 is a view for illustrating a deviation and a second signal in relation to time.

For example, the generator 16d determines a magnitude relationship of the deviation 30 with respect to a first threshold $E_1$, and in accordance with the determination result, changes the amplitude and the time interval of the second signal 32. As illustrated in FIG. 4, in the case where the deviation 30 is greater than or equal to the first threshold $E_1$, the generator 16d sets the amplitude of the second signal 32 to a first amplitude $A_1$, and sets the time interval to a first interval $T_1$. Then, when the deviation 30 becomes less than the first threshold $E_1$, the generator 16d sets the amplitude of the second signal 32 to a second amplitude $A_2$ which is less than the first amplitude $A_1$, and sets the time interval to a second interval $T_2$ which is wider than the first interval $T_1$. The first amplitude $A_1$, the second amplitude $A_2$, the first interval $T_1$, and the second interval $T_2$ may be derived in advance based on the results of performing experimentation and simulation regarding an amount of change of the relative position between the mold 1 and the substrate 2 when the amplitude and the time interval of the second signal are made to respectively change. Also, in the case where the deviation 30 is less than a second threshold $E_2$ which is less than the first threshold $E_1$, the generator 16d stops outputting the second signal 32. Specifically, supply of the second signal 32 to the driver 20 (the adder 16c) is stopped in the case where the deviation 30 becomes less than the second threshold $E_2$, and thereafter only the first signal 31 generated by the compensator 16b is supplied to the driver 20 (the adder 16c).

Here, in the example illustrated in FIG. 4, the amplitude and the time interval of the second signal 32 are both changed in accordance with the result of determining the magnitude relationship of the deviation with respect to the first threshold $E_1$, but limitation is not made to this, and configuration may be taken to change only one of the amplitude and the time interval of the second signal 32. Also, in the example illustrated in FIG. 4, the generator 16d changes the amplitude and the time interval of the second signal 32 in accordance with the magnitude relationship of the deviation with respect to the first threshold $E_1$, but configuration may be taken to change at least one of the amplitude and the time interval of the second signal 32 without setting the first threshold $E_1$. For example, configuration may be taken such that the generator 16d, without setting the first threshold $E_1$, makes the amplitude of the second signal 32 smaller and widens the time interval as the deviation 30 calculated by the subtractor 16a becomes smaller, and stops output of the second signal 32 in the case where the deviation 30 is less than the second threshold $E_2$. In such a case, the generator 16d may use information that indicates a relationship between the amplitude and the time interval of the second signal 32 and the deviation 30. This information may be obtained in advance based on the results of experimentation and simulation for the amount of change of the relative position between the mold 1 and the substrate 2 for when the amplitude and the time interval of the second signal are respectively caused to change.

As described above, the imprint apparatus 100 of the present embodiment, in the alignment process, adds second signals (second command values) with time intervals therebetween and that momentarily increase the driving force of the driver to the first signal, and supplies the result to the driver. With this, the driving force of the driver is caused to momentarily and discretely increase, and the relative position between the mold 1 and the substrate 2 can be changed effectively.

Second Embodiment

In the first embodiment, control in which, based on the deviation 30 calculated by the subtractor 16a, at least one of the amplitude and the time interval of the second signal 32 is changed was described. In the second embodiment, control for changing at least one of the amplitude and the time interval of the second signal 32 based on the relative velocity (the X and Y directions) between the mold 1 and the substrate 2 during the alignment process is described. The relative velocity between the mold 1 and the substrate 2 can be defined as the amount of change of the relative position per unit time, and hereinafter, it is referred to simply as "relative velocity". Also, the device configuration of the imprint apparatus 100 in the present embodiment is the same as in the first embodiment. Also, in the present embodiment, "supply control for the second signal 32 based on the relative velocity" may be performed in conjunction with "supply control of the second signal based on the deviation 30 calculated by the subtractor 16a" described in the first embodiment.

In the case where the relative velocity has not reached a target velocity (defined velocity), a suitable amount of time will be required for an alignment process, which may be disadvantageous in terms of throughput. For this reason, the generator 16d (the controller 16) of the present embodiment may change at least one of the amplitude and the time interval of the second signal 32 in accordance with the relative velocity. For example, the generator 16d may determine whether or not the relative velocity is smaller than a target velocity (magnitude relationship) and in a case where the relative velocity is determined to be smaller than the target velocity, may make the amplitude of the second signal larger and the time interval narrower in accordance with the difference between the relative velocity and the target velocity. At that time, the generator 16d may use information indicating the relationship between the difference between the relative velocity and the target velocity and the change amount for the amplitude and time interval of the second signal. This information may be obtained in advance based on the results of experimentation and simulation for the amount of change of the relative position between the mold 1 and the substrate 2 for when the amplitude and the time interval of the second signal are respectively caused to change.

Here, the generator 16d (the controller 16) can obtain the relative velocity based on the result of measurement in the position measurement device 17, for example. The generator 16d may estimate the relative velocity from the amount of change of the deviation 30 calculated by the subtractor 16a. Also, the relative velocity may change in accordance with the pressing force between the mold 1 and the imprint material 3 on the substrate. Accordingly, the generator 16d may provide a detector for detecting the pressing force between the mold 1 and the imprint material 3 in the imprint head 11 or the substrate stage 12, and may estimate the relative velocity based on the detection result in the detector. Furthermore, the relative velocity may change in accordance with the position on the substrate of the target shot region on which to perform the imprint process. For example, there are cases in which the surface treatment state and the state of concave and convex portions are different around the edges of the substrate as compared to around its center, and in such cases, the resistance force that impedes a change in the relative position between the mold 1 and the substrate 2 also differs between around the edges of the substrate and around its center. Accordingly, the generator 16d may estimate the relative velocity based on the position of the target shot region in the substrate.

As described above, the imprint apparatus of the present embodiment may change at least one of the amplitude and the time interval of the second signal 32 in accordance with the relative velocity. Consequently, it is possible to effectively change the relative position between the mold 1 and the substrate 2.

<Embodiment of Method of Manufacturing Article>

A method of manufacturing an article according to an embodiment of the present invention is suitable to manufacturing an article such as an element having a microstructure or micro-device such as a semiconductor device, for example. The method of manufacturing an article of the present embodiment includes a step for using the above described imprint apparatus (imprint method) to form a pattern on an imprint material supplied (applied) to a substrate, and a step of processing the substrate on which the pattern was formed in that step. Furthermore, the corresponding manufacturing method includes other well-known steps (such as oxidation, film formation, vapor deposition, doping, planarization, etching, resist separation, dicing, bonding, and packaging). The method of manufacturing an article of the present embodiment is advantageous in at least one of capabilities, quality, productivity, and manufacturing cost for the article in comparison to a conventional method.

A pattern of a cured material formed by using an imprint apparatus is used permanently for at least some of various articles, or is used temporarily when manufacturing various articles. An article is an electric circuit element, an optical element, a MEMS, a recording element, a sensor, a mold, or the like. The electric circuit element may be a volatile or nonvolatile semiconductor memory such as a DRAM, an SRAM, a flash memory, and an MRAM, a semiconductor element such as an LSI, a CCD, an image sensor, and an FPGA, or the like. The mold may be, for example, a mold for imprinting.

A pattern of a cured material is used unchanged as at least a portion of a constituent member of the foregoing article, or is temporarily used as a resist mask. The resist mask is removed after etching, ion implantation, or the like is performed in steps for processing the substrate.

Next, description is given regarding a detailed method of manufacturing the article. As illustrated in reference numeral 51 of FIG. 5, a substrate 1z, which is a silicon wafer on the surface of which a processed material 2z which is an insulating member or the like is formed, is prepared, and then, by an ink-jet method or the like, an imprint material 3z is applied to the surface of the processed material 2z. Here, a situation where the imprint material 3z in a plurality of droplet shapes has been applied onto the substrate is illustrated.

As illustrated by reference numeral 52 of FIG. 5, a mold 4z for imprinting is oriented so that a side thereof where a pattern composed of concave and convex portions is formed is caused to face toward the imprint material 3z on the substrate. As illustrated by reference numeral 53 of FIG. 5, the substrate 1z to which the imprint material 3z has been applied and the mold 4z are caused to be in contact, and pressure is applied. The imprint material 3z is filled into the spaces between the mold 4z and the processed material 2z. When light as energy for curing irradiates through the mold 4z in this state, the imprint material 3z is cured.

Figure 5:
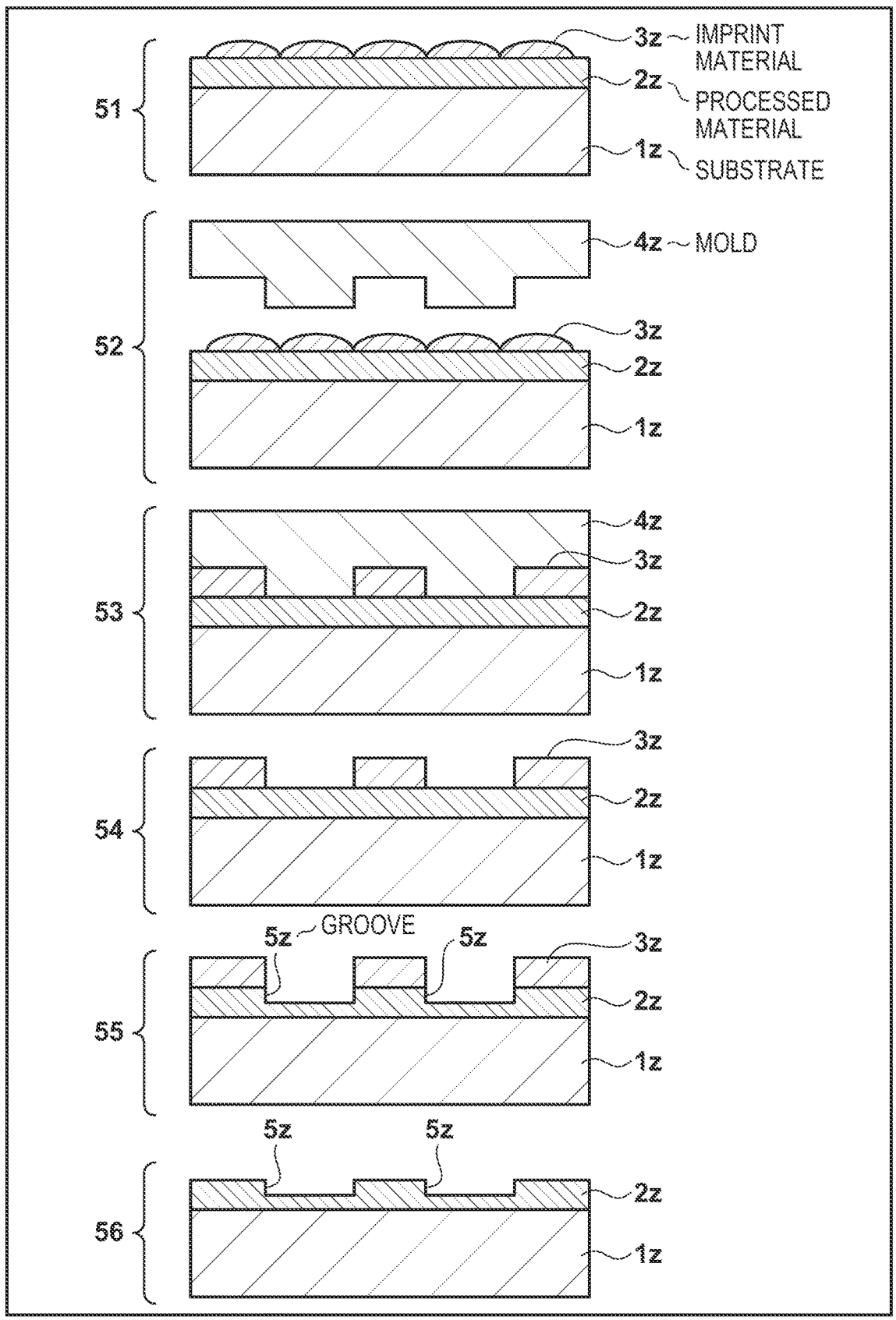
FIG. 5 is a view for illustrating a method of manufacturing an article.

As indicated by reference numeral 54 of FIG. 5, when the mold 4z and the substrate 1z are separated after the imprint material 3z is cured, a pattern of the cured material of the imprint material 3z is formed on the substrate 1z. The pattern of this cured material has a shape where a concave portion of the mold corresponds to a convex portion of the cured material and a convex portion of the mold corresponds to a concave portion of the cured material, in other words the pattern composed of concave and convex portions of the mold 4z ends up being transferred to the imprint material 3z.

As illustrated by reference numeral 55 of FIG. 5, when the pattern of the cured material is etched as an etching resistant mask, portions out of the surface of the processed material 2z where the cured material is not present or thinly remains are removed, and grooves 5z are achieved. As illustrated by reference numeral 56 of FIG. 5, when the pattern of the cured material is removed, it is possible to achieve an article in which the grooves 5z are formed on the surface of the processed material 2z. The pattern of the cured material is removed here, but, for example, the pattern may be used as a film for insulation between layers included in a semiconductor element or the like without being removed after processing, in other words as a constituent member of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-131489 filed on Jul. 4, 2017, which is hereby incorporated by reference herein in its entirety.

What is claimed is:

1. An imprint apparatus which forms a pattern of an imprint material on a substrate by using a mold, the apparatus comprising:
    an actuator configured to relatively drive the mold and the substrate;
    a scope configured to measure a relative position between the mold and the substrate by detecting a mark of the mold and a mark of the substrate; and
    a controller configured to perform alignment between the mold and the substrate, in accordance with a control clock period of the controller,
    wherein in the alignment, the controller is configured to generate a first signal for reducing a deviation between the relative position and a target relative position based on a measurement result by the scope, and control the actuator based on a signal obtained by combining, with the first signal, second signals with time intervals therebetween, and
    wherein the controller is configured to generate each of the second signals as an impulse signal that momentarily increases a driving force of the actuator, the impulse signal having a pulse width that is less than or equal to the control clock period of the controller.

2. The imprint apparatus according to claim 1, wherein the controller includes a compensator for generating the first signal based on the deviation, a generator for generating the second signal, and an adder for supplying, to the actuator, the signal obtained by combining the second signals with the first signal.

3. The imprint apparatus according to claim 1, wherein the controller generates each of the second signals so as to momentarily increase the driving force of the actuator by 0.1N or more.

4. The imprint apparatus according to claim 1, wherein the controller, in accordance with the deviation, changes at least one of amplitudes and the time intervals for the second signals.

5. The imprint apparatus according to claim 1, wherein the controller, in accordance with a magnitude relationship of the deviation with respect to a threshold, changes at least one of amplitudes and the time intervals for the second signals.

6. The imprint apparatus according to claim 1, wherein the controller stops generation of the second signals in a case where the deviation is less than a second threshold.

7. The imprint apparatus according to claim 1, wherein the controller, in accordance with a relative velocity between the mold and the substrate, changes at least one of amplitudes and the time intervals for the second signals.

8. The imprint apparatus according to claim 1, wherein the alignment is performed in a state in which the mold and the imprint material on the substrate are in contact with each other.

9. The imprint apparatus according to claim 1, wherein the controller is configured to generate the second signals such that each of the time intervals is greater than or equal to the pulse width.

10. The imprint apparatus according to claim 1, wherein the controller is configured to generate the second signals such that each of the time intervals is greater than or equal to the control clock period of the controller.

11. The imprint apparatus according to claim 1, wherein the controller is configured to generate the first signal and the second signals based on the deviation.

12. The imprint apparatus according to claim 1, wherein the controller is configured to generate the second signals such that amplitudes of the second signals decrease as the deviation decreases.

13. The imprint apparatus according to claim 1, wherein the controller is configured to generate the second signals such that widths of the time intervals increase as the deviation decreases.

14. The imprint apparatus according to claim 1, further comprising:
    a holder configured to hold the mold;
    a stage configured to hold the substrate; and
    a position measuring sensor configured to measure a relative position between the holder and the stage,
    wherein the actuator is configured to relatively drive the mold and the substrate by relatively driving the holder and the stage, and
    wherein the controller is configured to control the actuator, further based on measurement results by the position measuring sensor.

* * * * *